(12) United States Patent
Kang

(10) Patent No.: US 7,623,393 B2
(45) Date of Patent: Nov. 24, 2009

(54) SEMICONDUCTOR MEMORY APPARATUS

(75) Inventor: Khil-Ohk Kang, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 159 days.

(21) Appl. No.: 11/819,633

(22) Filed: Jun. 28, 2007

(65) Prior Publication Data

US 2008/0062777 A1 Mar. 13, 2008

(30) Foreign Application Priority Data

Sep. 13, 2006 (KR) ........................ 10-2006-0088744

(51) Int. Cl.
*G11C 5/14* (2006.01)
(52) U.S. Cl. .................... 365/189.09; 365/230.06; 365/230.03; 365/226; 365/189.08; 365/185.2
(58) Field of Classification Search ............ 365/189.09, 365/230.06, 230.03, 226, 189.08
See application file for complete search history.

(56) References Cited

U.S. PATENT DOCUMENTS

| 5,892,386 | A | 4/1999 | Lee et al. |
| 6,504,783 | B2 | 1/2003 | Jo |
| 6,704,237 | B2 * | 3/2004 | Park .......................... 365/226 |
| 6,842,382 | B2 * | 1/2005 | Kim et al. ............. 365/189.09 |
| 6,867,641 | B2 | 3/2005 | Kang et al. |
| 6,947,347 | B2 | 9/2005 | Fujioka |
| 6,958,947 | B2 | 10/2005 | Park et al. |
| 2004/0001385 | A1 | 1/2004 | Kang |

FOREIGN PATENT DOCUMENTS

| JP | 8147998 | 6/1996 |
| JP | 10125097 | 5/1998 |
| JP | 2002170387 | 6/2002 |
| JP | 2003085977 | 3/2003 |
| KR | 1020010017910 | 3/2001 |

* cited by examiner

*Primary Examiner*—Tuan T Nguyen
*Assistant Examiner*—Tha-O Bui
(74) *Attorney, Agent, or Firm*—Venable LLP; Jeffri A. Kaminski

(57) ABSTRACT

A semiconductor memory apparatus includes: a driving controller that decodes bank activating signals to generate a plurality of driving control signals, activates some of the driving control signals, and outputs the activated driving signals; and a plurality of internal voltage generators each of which outputs an internal voltage in response to a reference voltage and the corresponding driving control signal and is disposed between two different banks among a plurality of banks.

19 Claims, 3 Drawing Sheets

US 7,623,393 B2

SEMICONDUCTOR MEMORY APPARATUS

CROSS-REFERENCE TO RELATED PATENT APPLICATION

This application claims the benefit of Korean Patent Application No. 10-2006-0088744 filed on Sep. 13, 2006 in the Korean Intellectual Property Office, the disclosure of which is incorporated herein in its entirety by reference.

BACKGROUND OF THE INVENTION

1. Technical Field

The present invention relates to a semiconductor memory apparatus, and more particularly, to a semiconductor memory apparatus for providing an internal voltage to activated banks.

2. Related Art

In general, in order to improve the efficiency of read and write operations, semiconductor memory apparatuses perform the read and write operations with the entire cell matrix divided into a plurality of banks. In this case, the semiconductor memory apparatuses use an internal voltage which is generated such that the level of the internal voltage is kept at a constant level even if an external voltage varies.

The semiconductor memory apparatuses perform an active operation before the read and write operations. The active operation applies an elevated voltage to a word line provided in an active bank to turn on a cell transistor. When the cell transistor is turned on, data stored in a cell capacitor connected to the cell transistor is transmitted to a bit line sense amplifier (BLSA), and the bit line sense amplifier performs a sensing operation to amplify data. That is, general semiconductor memory apparatuses are provided with internal voltage generators in order to supply a power supply voltage required for the active operation, the write operation, and the read operation.

The general semiconductor memory apparatuses may have a four-bank structure. In this case, each bank includes M internal voltage generators (M is a natural number) in order to supply an internal voltage to the four banks. For example, each bank may include two internal voltage generators, that is, the four banks may include 8 internal voltage generators. In this case, when an active signal activates one bank, only two internal voltage generators are operated, which is inefficient. As a result, the efficiency of a chip per area is lowered. That is, since only two of the eight internal voltage generators are operated and the other internal voltage generators are not operated, the related art is inefficient from the viewpoint of area used.

SUMMARY OF THE INVENTION

Embodiments of the present invention provide a semiconductor memory apparatus capable of improving the generation efficiency of an internal voltage, thus reducing the size of a chip.

An embodiment of the present invention provides a semiconductor memory apparatus including: a reference voltage generator that generates a reference voltage; a bank activating signal generator that outputs zeroth to N-th bank activating signals (N is a natural number that is equal to or greater than 1); a driving controller that decodes the zeroth to N-th bank activating signals to output zeroth to N-th driving control signals; and an internal voltage generator that generates an internal voltage in response to the reference voltage and the driving control signals. In the semiconductor memory apparatus, when at least one of the zeroth to N-th bank activating signals is activated, at least one of the zeroth to N-th driving control signals is activated.

DESCRIPTION OF EXEMPLARY EMBODIMENT

Hereinafter, exemplary embodiments of the present invention will be described in detail with reference to the accompanying drawings.

Figure 1:
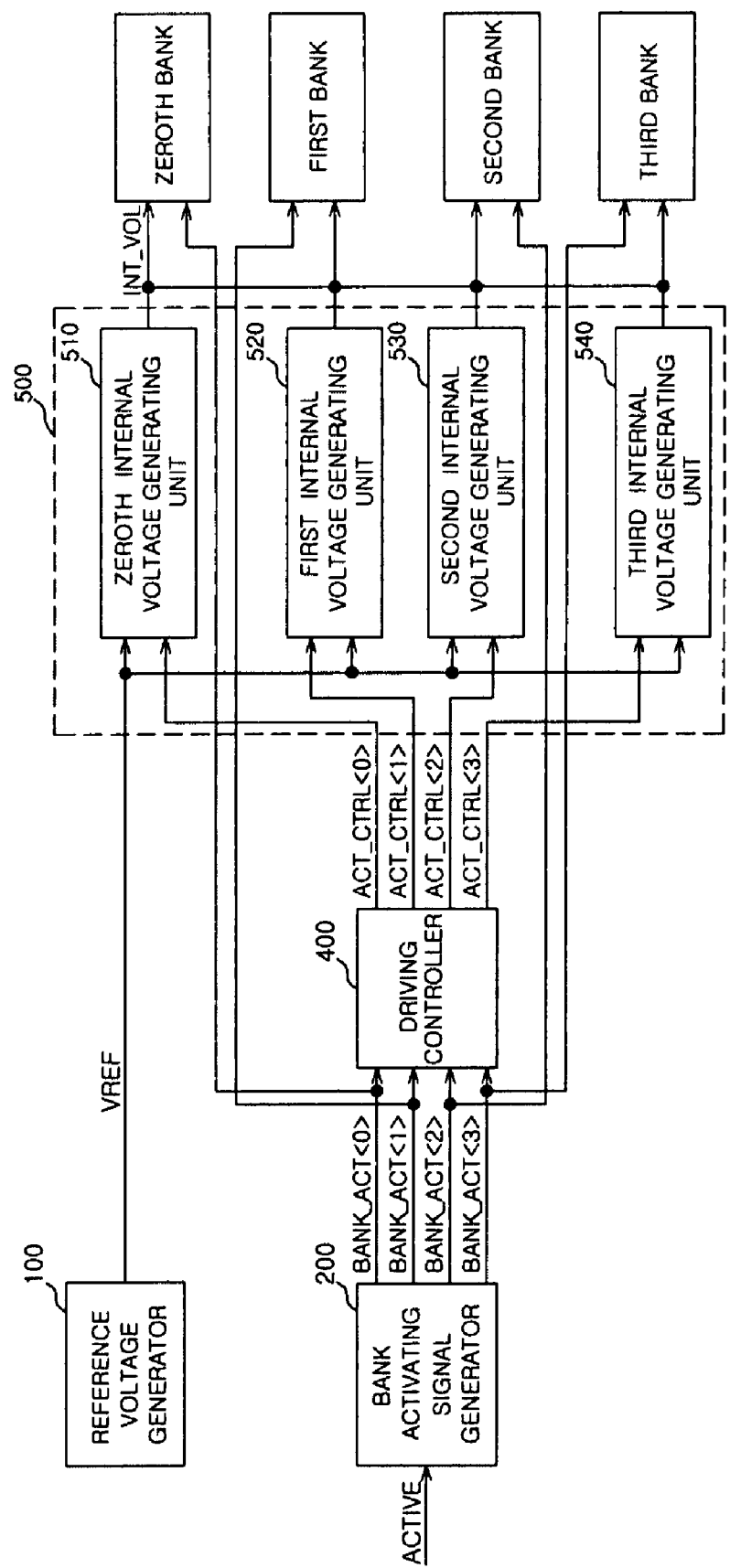
FIG. 1 is a block diagram schematically illustrating a semiconductor memory apparatus according to an embodiment of the invention.

Referring to FIG. 1, a semiconductor memory apparatus according to an embodiment of the invention includes a reference voltage generator 100, a bank activating signal generator 200, a driving controller 400, and an internal voltage generator 500.

The reference voltage generator 100 generates a stable reference voltage VREF. The reference voltage generator 100 may be formed of a general reference generating circuit.

The bank activating signal generator 200 outputs a bank activating signal BANK_ACT in response to an activating command ACTIVE from an external chipset.

The driving controller 400 decodes the bank activating signal ACTIVE and to output a driving control signal ACT_CTRL.

Figure 3:
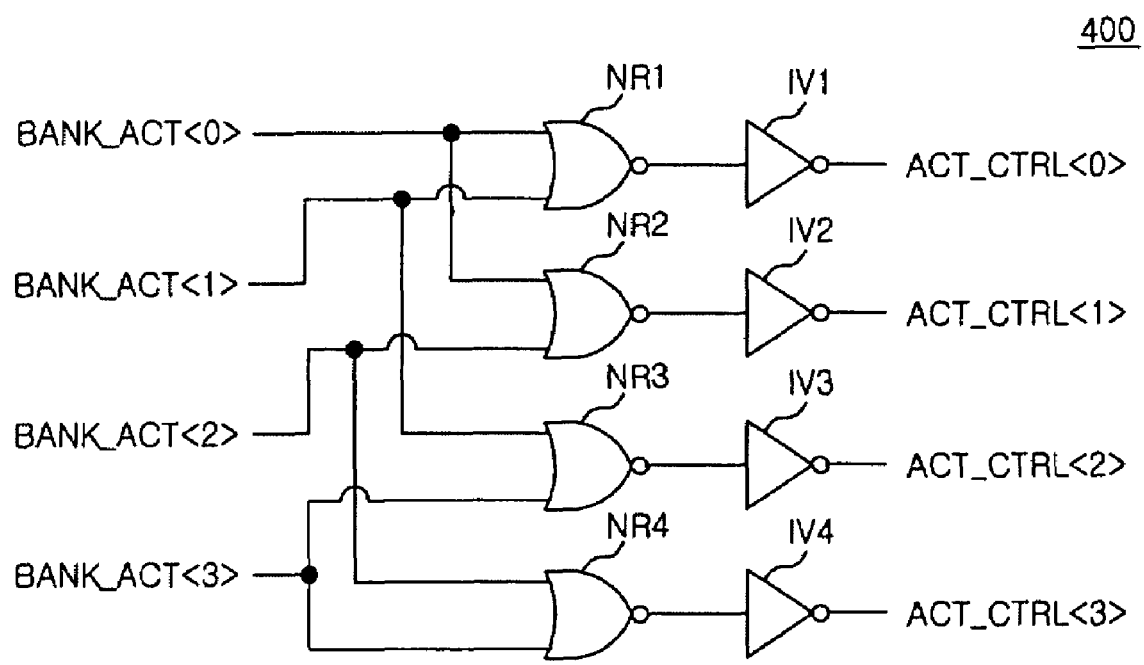
FIG. 3 is a detailed circuit diagram illustrating a driving controller shown in FIGS. 1 and 2.

The driving controller 400 activates at least one driving control signal ACT_CTRL when at least one of the bank activating signals BANK_ACT is activated. The driving controller 400 may be configured as shown in FIG. 3.

When the semiconductor memory apparatus has a four-bank structure, the bank activating signals BANK_ACT include zeroth to third bank activating signals BANK_ACT<0:3>, and the driving control signals ACT_CTRL include zeroth to third driving control signals ACT_CTRL<0:3>.

The internal voltage generator 500 generates an internal voltage INT_VOL in response to the reference voltage VREF and the driving control signal ACT_CTRL.

In this embodiment, the internal voltage INT_VOL will be regarded as a core voltage VCORE that is used as a driving voltage for a bit line sense amplifier BLSA, but the internal voltage INT_VOL is not limited to the core voltage VCORE.

The internal voltage generator 500 includes a zeroth internal voltage generating unit 510, a first internal voltage generating unit 520, a second internal voltage generating unit 530, and a third internal voltage generating unit 540.

The zeroth internal voltage generating unit 510 generates the internal voltage INT_VOL in response to the reference voltage VREF and the zeroth driving control signal ACT_CTRL<0>.

The first internal voltage generating unit 520 generates the internal voltage INT_VOL in response to the reference voltage VREF and the first driving control signal ACT_CTRL<1>.

The second internal voltage generating unit 530 generates the internal voltage INT_VOL in response to the reference voltage VREF and the second driving control signal ACT_CTRL<2>.

The third internal voltage generating unit 540 generates the internal voltage INT_VOL in response to the reference voltage VREF and the third driving control signal ACT_CTRL<3>.

The zeroth bank activating signal BANK_ACT<0> activates the zeroth bank, the first bank activating signal BANK_ACT<1> activates the first bank, the second bank activating signal BANK_ACT<2> activates the second bank, and the third bank activating signal BANK_ACT<3> activates the third bank.

In a semiconductor memory apparatus according to this embodiment, internal voltage lines through which the internal voltage INT_VOL is supplied are connected in a mesh.

The mesh means a structure in which the internal voltage lines formed of metal are connected in a mesh inside the chip.

When the zeroth bank is activated, the bit line sense amplifier BLSA provided in the zeroth bank is supplied with the internal voltage INT_VOL to perform a sensing operation. In this case, the zeroth internal voltage generating unit 510 generates and supplies the internal voltage INT_VOL. Since the first to third banks are in an inactive state, the first to third banks do not use the internal voltage INT_VOL. However, the internal voltage INT_VOL is applied to all of the zeroth to third banks through the internal voltage lines connected in a mesh.

Figure 2:
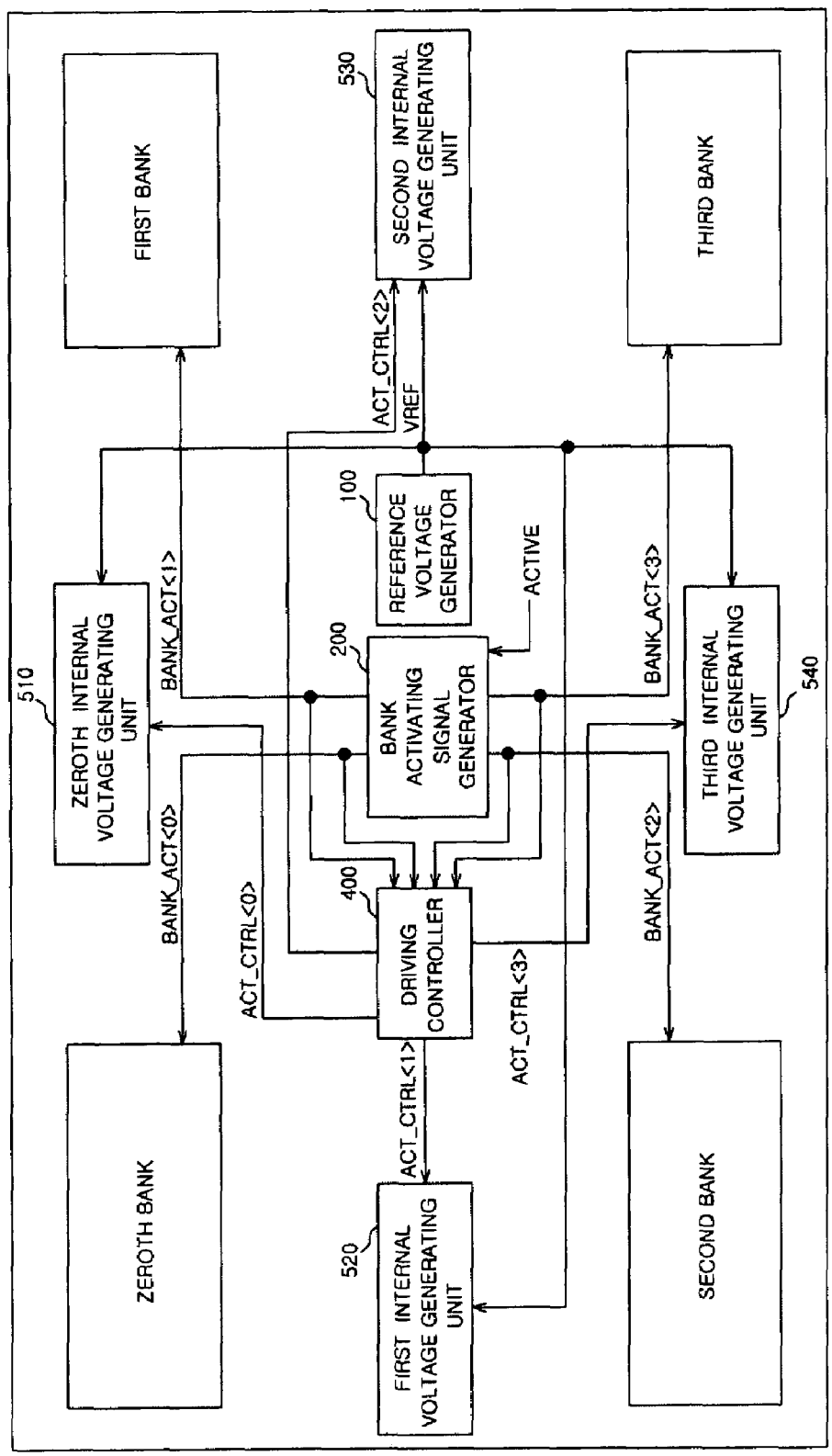
FIG. 2 is a detailed block diagram illustrating the semiconductor memory apparatus shown in FIG. 1.

FIG. 2 is a detailed block diagram illustrating the semiconductor memory apparatus having the four-bank structure according to an embodiment of the invention.

Referring to FIG. 2, the semiconductor memory apparatus according to an embodiment of the invention includes the zeroth internal voltage generating unit 510, the first internal voltage generating unit 520, the second internal voltage generating unit 530, and the third internal voltage generating unit 540.

The zeroth to third internal voltage generating units 510 to 540 are supplied with the reference voltage VREF generated by the reference voltage generator 100 and also respectively supplied with the zeroth to third bank activating signals BANK_ACT<0:3> generated by the bank activating signal generator 200 in response to the activating command ACTIVE.

The zeroth internal voltage generating unit 510 is disposed between the zeroth bank and the first bank, and the first internal voltage generating unit 520 is disposed between the zeroth bank and the second bank.

The second internal voltage generating unit 530 is disposed between the first bank and the third bank, and the third internal voltage generating unit 540 is disposed between the second bank and the third bank.

In FIG. 2, for convenience, the semiconductor memory apparatus having the four-bank structure is shown, but the invention is not limited thereto.

For example, in a semiconductor memory apparatus having an (N+1) bank structure (N is a natural number that is equal to or greater than 1), the bank activating signals BANK_ACT include zeroth to N-th activating signals BANK_ACT<0:N>. In addition, the driving control signals ACT_CTRL include zeroth to N-th driving control signals ACT_CTRL<0:N>, and the internal voltage generator 500 includes zeroth to N-th internal voltage generating units.

As shown in FIG. 2, in the semiconductor memory apparatus according to this embodiment, one of the zeroth to the third internal voltage generating units 510 to 540 is disposed between the two corresponding banks among the zeroth to third banks, but the invention is not limited thereto. A plurality of internal voltage generating units may be disposed between two corresponding banks. For example, assuming that the semiconductor memory apparatus according to this embodiment includes two sets of zeroth to third internal voltage generating units 510 to 540, this structure makes it possible to further improve driving power, as compared to the structure having one set of zeroth to third internal voltage generating units 510 and 540.

The driving controller 400 may include a decoder for decoding the zeroth to third bank activating signals BANK_ACT<0:3>. In this case, when at least one of the zeroth to third bank activating signals BANK_ACT<0:3> is activated, the driving controller 400 activates at least one of the zeroth to third driving control signals ACT_CTRL<0:3>.

The zeroth to third internal voltage generating units 510 and 540 respond to the zeroth to the third driving control signals ACT_CTRL<0:3>, respectively, and maybe formed of voltage down converters that are supplied with an external voltage to generate the internal voltage INT_VOL in response to the result of comparison between the reference voltage VREF and voltages divided from the internal voltage INT_VOL.

Although not shown in FIG. 2, in the semiconductor memory apparatus according to this embodiment, the internal voltage lines are connected to the zeroth to third banks in a mesh.

FIG. 3 is a detailed circuit diagram illustrating the driving controller 400 shown in FIGS. 1 and 2.

The driving controller 400 includes first to fourth NOR gates NR1 to NR4 and first to fourth inverters IV1 to IV4.

The first NOR gate NR1 has two input terminals to which the zeroth bank activating signal BANK_ACT<0> and the first bank activating signal BANK_ACT<1> are input.

The first inverter IV1 has an input terminal connected to an output terminal of the first NOR gate NR1 and an output terminal that outputs the zeroth driving control signal ACT_CTRL<0>.

The second NOR gate NR2 has two input terminals to which the zeroth bank activating signal BANK_ACT<0> and the second bank activating signal BANK_ACT<2> are input.

The second inverter IV2 has an input terminal connected to an output terminal of the second NOR gate NR2 and an output terminal that outputs the first driving control signal ACT_CTRL<1>.

The third NOR gate NR3 has two input terminals to which the first bank activating signal BANK_ACT<1> and the third bank activating signal BANK_ACT<3> are input.

The third inverter IV3 has an input terminal connected to an output terminal of the third NOR gate NR3 and an output terminal that outputs the second driving control signal ACT_CTRL<2>.

The fourth NOR gate NR4 has two input terminals to which the second bank activating signal BANK_ACT<2> and the third bank activating signal BANK_ACT<3> are input.

The fourth inverter IV4 has an input terminal connected to an output terminal of the fourth NOR gate NR4 and an output terminal that outputs the third driving control signal ACT_CTRL<3>.

The structure of the driving controller 400 is not limited to the above. For example, the driving controller 400 may be composed of a plurality of logic elements (for example, OR gates) each of which is supplied with a plurality of different signals among the zeroth to third bank activating signals BANK_ACT<0:3> to perform an OR operation.

Next, the operation of the semiconductor memory apparatus according to this embodiment of the invention will be described with reference to the accompanying drawings.

In this embodiment, it is assumed that the semiconductor memory apparatus has a four-bank structure (zeroth to third banks). In this case, in the semiconductor memory apparatus, the reference voltage generator 100 generates a stable reference voltage VREF, and the bank activating signal generator 200 activates the bank activating signal BANK_ACT in response to an activating command ACTIVE from an external chipset. The driving controller 400 outputs the driving control signal ACT_CTRL in response to the bank activating signal BANK_ACT, and the internal voltage generator 500 supplied with the reference voltage VREF and the driving control signal ACT_CTRL is activated in response to the driving control signal ACT_CTRL to generate the internal voltage INT_VOL. In this case, since the internal voltage lines through which the internal voltage INT_VOL is supplied are connected in a mesh, the internal voltage INT_VOL is applied to all of the banks.

More specifically, the bank activating signal generator 200 activates the zeroth to third bank activating signals BANK_ACT<0:3> that are input to predetermined banks, in response to the activating command ACTIVE to activate the predetermined banks.

When the zeroth bank activating signal BANK_ACT<0> is activated and the first to third activating signals BANK_ACT<1:3> are inactivated, the first NOR gate NR1 and the first inverter IV1 perform an OR operation of the zeroth bank activating signal BANK_ACT<0> and the first activating signal BANK_ACT<1>, and the second NOR gate NR2 and the second inverter IV2 perform an OR operation of the zeroth bank activating signal BANK_ACT<0> and the second activating signal BANK_ACT<2>, as shown in FIG. 3. Therefore, the driving controller 400 activates the zeroth driving control signal ACT_CTRL<0> and the first driving control signal ACT_CTRL<1> and outputs them. In addition, the driving controller 400 inactivates the second driving control signal ACT_CTRL<2> and the third driving control signal ACT_CTRL<3> and outputs them.

When the zeroth bank activating signal BANK_ACT<0> is activated, the zeroth bank is activated, and both the zeroth internal voltage generating unit 510 supplied with the zeroth driving control signal ACT_CTRL<0> and the first internal voltage generating unit 520 supplied with the first driving control signal ACT_CTRL<1> are activated, so that the internal voltage INT_VOL is output to the zeroth bank.

When the third bank activating signal BANK_ACT<3> is activated and the zeroth to second activating signals BANK_ACT<0:2> are inactivated, the third NOR gate NR3 and the third inverter IV3 perform an OR operation of the first bank activating signal BANK_ACT<1> and the third activating signal BANK_ACT<3>, as shown in FIG. 3.

The fourth NOR gate NR4 and the fourth inverter IV4 perform an OR operation of the second bank activating signal BANK_ACT<2> and the third activating signal BANK_ACT<3>. Therefore, the driving controller 400 activates the second driving control signal ACT_CTRL<2> and the third driving control signal ACT_CTRL<3> and outputs them. In addition, the driving controller 400 inactivates the zeroth driving control signal ACT_CTRL<0> and the first driving control signal ACT_CTRL<1> and outputs them.

When the third bank activating signal BANK_ACT<3> is activated, the third bank is activated, and both the second internal voltage generating unit 530 supplied with the second driving control signal ACT_CTRL<2> and the third internal voltage generating unit 540 supplied with the third driving control signal ACT_CTRL<3> are activated, so that the internal voltage INT_VOL is output to the third bank.

That is, in the four-bank structure, the semiconductor memory apparatus according to the related art includes two sets of zeroth to third internal voltage generating units to supply the internal voltage INT_VOL. In contrast, in this embodiment of the invention, the semiconductor memory apparatus includes one set of zeroth to third internal voltage generating units 510 and 540 to supply the internal voltage INT_VOL. Therefore, when the number of banks increases in the semiconductor memory apparatus, the area of the semiconductor memory apparatus according to the invention is smaller than that of the semiconductor memory apparatus according to the related art, which results in reduction in the size of a semiconductor memory apparatus.

It will be apparent to those skilled in the art that various modifications and changes may be made without departing from the scope and spirit of the present invention. Therefore, it should be understood that the above embodiments are not limitative; but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A semiconductor memory apparatus comprising:
   a reference voltage generator that generates a reference voltage;
   a bank activating signal generator that outputs zeroth to N-th bank activating signals for activating a plurality of banks, where N is a natural number that is equal to or greater than 1;
   a driving controller that decodes the zeroth to N-th bank activating signals to output zeroth to N-th driving control signals; and
   an internal voltage generator that generates an internal voltage in response to the reference voltage and the driving control signals, wherein the internal voltage generator includes a plurality of internal voltage generating units and respective ones of the internal voltage generating units are configured to correspond to respective ones of the banks,
   wherein, when at least one of the zeroth to N-th bank activating signals is activated, at least one of the zeroth to N-th driving control signals is activated,
   wherein an activated bank receives the internal voltages from the internal voltage unit of the corresponding activated bank and one of the internal voltage units of the non-selected banks.

2. The semiconductor memory apparatus of claim 1, wherein the internal voltage is a core voltage.

3. The semiconductor memory apparatus of claim 1, wherein the driving controller is a decoder.

4. The semiconductor memory apparatus of claim 1, wherein the driving controller includes:
   a plurality of logic elements each of which is supplied with a plurality of different signals among the zeroth to N-th bank activating signals and performs an OR operation of the signals.

5. The semiconductor memory apparatus of claim 1, wherein the internal voltage generator includes:
   zeroth to N-th internal voltage generating units that are activated in response to a respective one of the driving control signals and are supplied with an external voltage in response to results of a comparison between the reference voltage and voltages divided from the internal voltage to output the internal voltage.

6. The semiconductor memory apparatus of claim 5, wherein the zeroth to N-th internal voltage generating units are voltage down converters.

7. A semiconductor memory apparatus comprising:

a plurality of banks;

a driving controller that decodes bank activating signals to generate a plurality of driving control signals, activates some of the driving control signals, and outputs activated driving control signals; and a plurality of internal voltage generating units each of which outputs an internal voltage in response to a reference voltage and a respective one of the driving control signals and is disposed between two different banks among the plurality of banks, and respective ones of internal voltage generating units correspond to respective ones of the banks, wherein, an activated bank receives the internal voltages from the internal voltage unit of the corresponding activated bank and the internal voltage unit of non-selected bank which is adjacent to the corresponding activated bank.

8. The semiconductor memory apparatus of claim 7, further comprising:

a reference voltage generator that generates the reference voltage; and a bank activating signal generator that outputs the bank activating signals.

9. The semiconductor memory apparatus of claim 7, wherein the internal voltage is a core voltage.

10. The semiconductor memory apparatus of claim 7, wherein the bank activating signals activate the corresponding banks.

11. The semiconductor memory apparatus of claim 7, wherein the driving controller is a decoder.

12. The semiconductor memory apparatus of claim 11, wherein the driving controller includes:

a plurality of logic elements each of which is supplied with some of the bank activating signals and performs an OR operation of the signals.

13. The semiconductor memory apparatus of claim 7, wherein the internal voltage generator includes:

a plurality of voltage down converters that are activated in response to a respective one of the driving control signals and are supplied with an external voltage in response to the results of a comparison between the reference voltage and voltages divided from the internal voltage to output the internal voltage.

14. A semiconductor memory apparatus comprising:

a first bank that is activated in response to a first bank activating signal;

a second bank that is activated in response to a second bank activating signal;

a first and second internal voltage generating units disposed adjacent to the first bank; and the first and a third internal voltage generating units disposed adjacent to the second bank, wherein, an activated one of the banks receives the internal voltages from an internal voltage unit of the corresponding activated bank and an internal voltage unit of an non-selected one of the banks which is adjacent to the corresponding activated bank.

15. The semiconductor memory apparatus of claim 14, wherein the internal voltage is a core voltage.

16. The semiconductor memory apparatus of claim 14, further comprising:

a driving controller that outputs driving control signals which are activated when at least one of the first bank activating signal and the second bank activating signal is activated.

17. The semiconductor memory apparatus of claim 16, wherein the driving controller includes logic elements each performing an OR operation.

18. The semiconductor memory apparatus of claim 16, wherein the internal voltage generators are activated in response to the driving control signals.

19. The semiconductor memory apparatus of claim 18, wherein the internal voltage generators are voltage down converters that are activated in response to a respective one of driving control signals and are supplied with an external voltage in response to the results of a comparison between a reference voltage and voltages divided from the internal voltage to generate the internal voltage.

* * * * *